United States Patent
Lim et al.

(10) Patent No.: US 8,449,782 B2
(45) Date of Patent: *May 28, 2013

(54) SEE-THROUGH-TYPE INTEGRATED THIN-FILM SOLAR CELL, METHOD OF MANUFACTURING THE SAME AND METHOD OF ELECTRICALLY SERIES CONNECTING UNIT CELLS THEREOF

(75) Inventors: Koeng Su Lim, Daejeon (KR); Seong Won Kwon, Daegu (KR); Joong Hwan Kwak, Seoul (KR); Ji Hwan Yang, Jeollanam-do (KR); Sang Il Park, Chungbuk (KR); Sang Hwan Kim, Seoul (KR); Yoo Jin Lee, Gyeonggi-do (KR); Jin Koog Shin, Seoul (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 1167 days.

This patent is subject to a terminal disclaimer.

(21) Appl. No.: 11/610,366

(22) Filed: Dec. 13, 2006

(65) Prior Publication Data

US 2007/0131272 A1    Jun. 14, 2007

(30) Foreign Application Priority Data

Dec. 14, 2005 (KR) .................. 10-2005-0123355

(51) Int. Cl.
*B29D 11/00* (2006.01)
(52) U.S. Cl.
CPC .................................... *B29D 11/00* (2013.01)
USPC .............................................. 216/24; 216/66
(58) Field of Classification Search
CPC ....................................................... B29D 11/00
USPC ........................................ 216/24, 66; 136/244
See application file for complete search history.

(56) References Cited

U.S. PATENT DOCUMENTS

| | | | |
|---|---|---|---|
| 3,994,012 A | 11/1976 | Warner, Jr. | |
| 4,200,472 A | 4/1980 | Chappell et al. | |
| 4,501,636 A | 2/1985 | Valley | |
| 4,514,582 A * | 4/1985 | Tiedje et al. | 136/256 |
| 4,631,351 A * | 12/1986 | Tawada et al. | 136/244 |
| 4,740,431 A | 4/1988 | Little | |
| 4,758,526 A * | 7/1988 | Thalheimer | 438/80 |

(Continued)

FOREIGN PATENT DOCUMENTS

| | | |
|---|---|---|
| CN | 1498426 A | 5/2004 |
| EP | 1 583 155 A1 | 10/2005 |

(Continued)

OTHER PUBLICATIONS

Non-Final Office Action issued for U.S. Appl. No. 11/610,254, filed Dec. 13, 2006, Mailed on Sep. 16, 2009, 26 pages.

(Continued)

*Primary Examiner* — Shamim Ahmed
(74) *Attorney, Agent, or Firm* — Foley & Lardner LLP

(57) ABSTRACT

Provided is a method of manufacturing a see-through-type integrated solar cell and a method of manufacturing the same. The method comprises forming a first conductive material being apart and strip patterned on a transparent substrate so that the first conductive material comprises a predetermined space for enabling light to directly pass through the transparent substrate, forming a solar cell (semiconductor) layer, obliquely depositing a second conductive material and etching the solar cell layer using the second conductive material layer as a mask.

4 Claims, 11 Drawing Sheets

U.S. PATENT DOCUMENTS

| | | | |
|---|---|---|---|
| 5,252,139 A | | 10/1993 | Schmitt et al. |
| 5,421,908 A | * | 6/1995 | Yoshida et al. ............... 136/244 |
| 6,168,968 B1 | * | 1/2001 | Umemoto et al. .............. 438/96 |
| 6,172,297 B1 | | 1/2001 | Hezel et al. |
| 6,207,890 B1 | | 3/2001 | Nakai et al. |
| 6,299,785 B1 | | 10/2001 | Shimokawa et al. |
| 6,423,567 B1 | * | 7/2002 | Ludemann et al. ............. 438/83 |
| 7,019,207 B2 | | 3/2006 | Harneit et al. |
| 7,355,114 B2 | | 4/2008 | Ojima et al. |
| 7,615,391 B2 | | 11/2009 | Ojima et al. |
| 7,927,497 B2 | | 4/2011 | Lim et al. |
| 2003/0121542 A1 | | 7/2003 | Harneit et al. |
| 2004/0035460 A1 | | 2/2004 | Gonsiorawski |
| 2004/0050816 A1 | * | 3/2004 | Asakawa et al. .................. 216/2 |
| 2004/0118444 A1 | | 6/2004 | Duggal et al. |
| 2004/0123897 A1 | | 7/2004 | Ojima et al. |
| 2004/0187916 A1 | * | 9/2004 | Hezel ........................... 136/256 |
| 2007/0131271 A1 | | 6/2007 | Lim et al. |
| 2007/0131272 A1 | | 6/2007 | Lim et al. |
| 2008/0216890 A1 | | 9/2008 | Lim |
| 2010/0018574 A1 | | 1/2010 | Kwon et al. |
| 2010/0300525 A1 | | 12/2010 | Lim et al. |
| 2011/0030777 A1 | | 2/2011 | Lim et al. |

FOREIGN PATENT DOCUMENTS

| | | |
|---|---|---|
| JP | 61-035573 | 2/1986 |
| JP | 63-042180 | 2/1988 |
| JP | 07-202229 | 8/1995 |
| JP | 08-274360 | 10/1996 |
| JP | 11-026793 | 1/1999 |
| JP | 11-097723 | 4/1999 |
| JP | 11-097723 A | 4/1999 |
| JP | 11-312860 | 11/1999 |
| KR | 2002-0005152 | 1/2002 |
| WO | WO-02/059981 A2 | 8/2002 |
| WO | WO 2006/107154 A1 | 10/2006 |

OTHER PUBLICATIONS

Bernier, Lindsey A., Non-final Office Action on U.S. Appl. No. 12/568,360 mailed May 11, 2010; 22 pages.; US Patent and Trademark Office.

Bernier, Lindsey A.; Non-final Office Action on U.S. Appl. No. 12/568,370 mailed May 11, 2010; 16 pages; U.S. Patent and Trademark Office.

Bernier, Linesey A.; Office Action on U.S. Appl. No. 11/610,254 mailed May 26, 2010; 30 pages; US Patent and Trademark Office.

Olsen, Allan W.; Non-final office action on U.S. Appl. No. 11/908,826 mailed Apr. 14, 2010; 11 pages; US Patent and Trademark Office.

USPTO Final Office Action on U.S. Appl. No. 12/568,360 dated Jan. 19, 2011; 21 pages.

USPTO Final Office Action on U.S. Appl. No. 12/568,370 dated Jan. 19, 2011; 15 pages.

USPTO Non-final Office Action on U.S. Appl. No. 11/610,254 dated Jan. 19, 2011; 16 pages.

USPTO Final Office Action on U.S. Appl. No. 11/610,254 dated Jul. 6, 2011; 12 pages.

USPTO Office Action on U.S. Appl. No. 12/568,370 dated Jul. 6, 2011; 10 pages.

USPTO Office Action on U.S. Appl. No. 12/568,360 dated Jul. 6, 2011; 10 pages.

Examination Report issued in European application No. 06025935.5-1528; Jan. 4, 2013; 6 pages.

* cited by examiner

SEE-THROUGH-TYPE INTEGRATED THIN-FILM SOLAR CELL, METHOD OF MANUFACTURING THE SAME AND METHOD OF ELECTRICALLY SERIES CONNECTING UNIT CELLS THEREOF

This Nonprovisional application claims priority under 35 U.S.C. §119(a) on Patent Application No. 10-2005-0123355 filed in Korea on Dec. 14, 2005, the entire contents of which are hereby incorporated by reference.

BACKGROUND

1. Field

The present invention relates to a thin film solar cell, and more particularly, to a see-through-type thin film solar cell and a method of manufacturing the same.

2. Description of the Background Art

Solar cell refers to a semiconductor device for directly converting solar energy into electricity. The solar cell can be mainly classified into a silicon-based solar cell, a compound-based solar cell, and an organic solar cell depending on its use material.

The silicon-based solar cell is in detail classified into a single crystalline silicon solar cell, a polycrystalline silicon solar cell, and an amorphous silicon solar cell depending on a semiconductor phase.

The solar cell is classified into a bulk (substrate) solar cell and a thin film solar cell depending on a semiconductor thickness. In the thin film solar cell, a semiconductor layer has a thickness of to several μm to several tens of μm.

In the silicon-based solar cell, the single crystalline and polycrystalline silicon solar cells belong to the bulk solar cell. The amorphous silicon solar cell belongs to the thin film solar cell.

The compound-based solar cell is classified into the bulk solar cell based on gallium arsenide (GaAs) and indium phosphide (InP) of groups III-V, and the thin film solar cell based on cadmium telluride (CdTe) of groups II-VI and copper indium diselenide (CIS) ($CuInSe_2$) of groups I-III-VI. The organic solar cell is mainly classified into an organic molecular solar cell and an organic/inorganic complex solar cell. In addition, there is a dye-sensitized solar cell. They all belong to the thin film solar cell.

Among several kinds of solar cells, the bulk silicon solar cell having a high-energy conversion efficiency and a cheap manufacturing cost is being popularly utilized for ground power.

In recent years, there is a trend in which a raw material increases in price because of its shortage as a demand for the bulk silicon solar cell suddenly increases. A thin film solar cell whose silicon raw material can reduce by one several hundredth of the present time is being greatly required for the development of a technology for low pricing and mass production of a solar cell for massive ground power.

FIG. 1 is a diagram illustrating a structure of a unit cell of a conventional integrated thin-film solar cell. FIG. 2 is a diagram illustrating an example of a conventional integrated thin-film solar cell.

As shown in FIGS. 1 and 2, a conventional integrated thin-film solar cell 1 is of unit cell structure in which a plurality of unit cells 20 connect in series on a glass substrate or transparent plastic substrate 10 (hereinafter, referred to as "transparent substrate").

In the integrated thin-film solar cell, the unit cell includes a transparent electrode 22 mutually cut (insulated), and formed in a band shape on the transparent substrate 10 that is an insulator; a unit solar cell (semiconductor) layer 24 covering the transparent electrode 22 and formed in a band shape; and a metal back electrode layer 26 covering the solar cell layer 24 and formed in a band shape. The integrated thin-film solar cell is of structure in which the plurality of unit cells 20 connect in series with each other. The metal back electrode is covered with a back protective layer 30 formed of resin for preventing electrical short-circuiting of the solar cell and protecting the solar cell.

In general, a laser patterning method, a chemical vaporization machining (CVM) method, a metal probe-based mechanical scribing method are being used to manufacture the integrated thin-film solar cell 1.

The laser patterning method refers to a technology for etching the transparent electrode 22, the solar cell (semiconductor) layer 24, and the metal back electrode layer 26, mainly using YAG laser beam. A detailed usage method will be described as follows.

FIG. 2 illustrates the example of the conventional integrated thin-film solar cell.

As shown in FIG. 2, the transparent electrode 22 is formed on the transparent substrate 10, and is etched using laser beam under the atmosphere. After that, the solar cell (semiconductor) layer 24 is formed and is cut (insulated) using the laser beam under the atmosphere. The metal back electrode layer 26 is formed and is etched using the laser patterning process under the atmosphere, thereby connecting the solar cells in series and forming the unit cell of the integrated solar cell.

A drawback of the laser patterning method will be described below.

As shown in FIG. 2, the transparent electrode 22 is formed on an entire upper surface of the transparent substrate 10. After that, the transparent electrode 22 is cut in the laser patterning method, and is cut (insulated) in the band shape having a predetermined width. Then, the cut transparent electrode 22 has a width of 50 μm to several 100 μm in general.

After that, a process of forming the solar cell (semiconductor) layer 24 is performed mostly under vacuum whereas the laser patterning for cutting the solar cell (semiconductor) layer 24 is performed under the atmosphere. This makes it impossible to perform a sequential process under the vacuum, thereby deteriorating an operation efficiency of a manufacturing device. This inevitably results in a price increase for the solar cell. Also, there is a drawback that the unit cell is deteriorated in characteristic due to adherence of moisture and a contaminant because the substrate is exposed to the atmosphere to etch the solar cell layer 10.

Next, the metal back electrode layer 26 is formed under the vacuum by a sputtering method and is again laser-patterned under the atmosphere, thereby manufacturing the unit cell of the integrated solar cell. This process can cause process discontinuity and contaminant drawbacks as described above. An ineffective area (cut width) between the unit cells 20 of the solar cell increases through a total of three-times laser patterning including two times of laser patterning for cutting the transparent electrode 22 and the solar cell (semiconductor) layer 24, and one time of laser patterning for cutting the metal back electrode layer 26 and concurrently connecting the solar cells in series. Thus, a loss of an effective area of the solar cell increases. There is a drawback that a laser patterning equipment is expensive, and a precision position control system is required for patterning at an accurate position, thereby increasing a manufacturing cost.

The chemical vaporization machining method refers to a technology for simultaneously cutting the solar cell (semiconductor) layer into the plurality of unit cells having a uniform width, by locally generating atmospheric pressure plasma around line electrodes that have diameters of tens of μm and are arranged in a grid form in proximity to an upper portion of a substrate, using $SF_6$/He gas.

The chemical vaporization machining method has a feature of short process time, excellent film selectivity, and less film damage compared with the laser patterning method. The chemical vaporization machining method has an advantage of preventing a performance of the solar cell from being deteriorated by the exposure of the substrate to the atmosphere because etching is performed under the vacuum unlike the laser patterning method, and reducing the manufacturing cost compared with the laser patterning method.

However, the precision position control system capable of accurately controlling a position within a vacuum device is needed because the etching should be performed in an accurate position adaptively to the patterned transparent electrode. This is of very difficult matter when the solar cell is manufactured using a large-scale substrate. A gap obtained by the etching is about 200 μm to the minimum, and is greater than an insulation gap obtained using the laser patterning method. Thus, there is a drawback of increasing the loss of the effective area of the solar cell.

Another etching method is the mechanical scribing method. This method makes it possible to perform collective scribing, by a plurality of metal probes, correspondingly to the number of necessary unit cells, and is greater in extensibility and adaptability to high-speed processing than the laser patterning method. The mechanical scribing method refers to an etching method in which device and operation costs are most cheap compared with the above two methods.

In a CIS solar cell for example, a CdS/CIS layer is being popularly used to manufacture the CIS solar cell because it is softer than molybdenum (Mo), thereby facilitating scribing based on the scribing method.

However, the conventional mechanical scribing method has a drawback that it needs the laser patterning equipment for etching a back electrode (Mo) and a front electrode (ZnO), and the precision position control device for accurately controlling the position because it is limitedly used only for the solar cell (semiconductor) layer.

SUMMARY

Accordingly, the present invention is to provide an see-through-type integrated thin-film solar cell for reducing an insulation gap between unit elements reduces, thereby increasing an effective area of the solar cell, performing all processes under vacuum after forming a transparent electrode, and connecting the unit elements of the solar cell in series by a simple process, thereby achieving its unit cell type.

Also, the present invention is to provide a method of manufacturing an see-through-type integrated thin-film solar cell, for preventing deterioration of a performance of a unit cell, and reducing a manufacturing cost.

Also, the present invention is to provide a method of manufacturing an see-through-type integrated thin-film solar cell electrically series connected with unit cells, for acquiring a desired high voltage from one unit cell even while the unit cell has as little performance deterioration as disregardful.

In one aspect, method of manufacturing a see-through-type thin-film integrated solar cell. The method comprises forming a first conductive material being apart and strip patterned on a transparent substrate so that the first conductive material comprises a predetermined space for enabling light to directly pass through the transparent substrate; forming a solar cell (semiconductor) layer; obliquely depositing a second conductive material; and etching the solar cell layer using the second conductive material layer as a mask.

The first conductive material extends by a predetermined interval on a boundary surface of a unit cell.

The predetermined space may be provided in a hexagonal shape.

In another aspect, see-through-type integrated thin-film solar cell is made by the above method.

In another aspect, there is provided a method of electrically series interconnecting see-through-type integrated thin-film solar unit cells. The method comprises forming a first conductive material strip patterned on a transparent substrate; forming a second conductive material layer being apart and strip patterned to electrically connect a portion of the first conductive material layer with any one of adjacent solar cells, and to be spaced a predetermined distance apart; forming a solar cell(semiconductor) layer; obliquely depositing a third conductive material; etching the solar cell layer using the third conductive material layer as a mask; and forming a fourth conductive material layer to electrically connect the first conductive material layer with the third conductive material layer.

The first, third, and fourth conductive materials may be conductive metal materials.

The second conductive material may be a transparent conductive material.

The forming and patterning of the second conductive material may further comprise forming a dummy pattern of the second conductive material on the first conductive material to be spaced apart from the patterned second conductive material.

The depositing of the third conductive material may be performed using electron beam or thermal deposition.

The electrically connecting of the first and third conductive materials may electrically connect the first conductive material with the third conductive material in series.

The forming of the fourth conductive material may be performed using any one of metal mask, ink jet, screen printing, nano imprint, and stamping.

In a further another aspect, there is provided a method of electrically series interconnecting see-through-type integrated thin-film solar unit cells. The method comprises forming a first conductive material being apart and strip patterned on a transparent substrate to be spaced a predetermined distance apart; forming a solar cell(semiconductor) layer; obliquely depositing a second conductive material; etching the solar cell layer using the second conductive material layer as a mask; and forming a third conductive material to electrically connect the first conductive material layer with the second conductive material layer.

The first conductive material may be a transparent conductive material.

The second, third, and fourth conductive materials may be conductive metal materials.

The depositing of the third conductive material may be performed using electron beam or thermal deposition.

The electrically connecting of the second and third conductive materials may electrically connect the second conductive material with the third conductive material in series.

The forming of the fourth conductive material may be performed using any one of metal mask, ink jet, screen printing, nano imprint, and stamping.

In a yet another aspect, there is provided a method of electrically series interconnecting see-through-type integrated thin-film solar unit cells. The method comprises forming a first conductive material being apart and strip patterned on a transparent substrate; forming a second conductive material layer being apart and strip patterned to electrically connect a portion of the first conductive material layer with any one of adjacent solar cells, and to be spaced a predetermined distance apart; forming a solar cell(semiconductor) layer; obliquely depositing a third conductive material; obliquely depositing a fourth conductive material; etching the solar cell layer using the third and fourth conductive materials as masks; and forming a fifth conductive material to electrically connect the first conductive material layer with the third conductive material layer.

The first conductive material may be a transparent conductive material.

The second and third conductive materials may be conductive metal materials.

The first conductive material may be formed and patterned to have a partial step.

The step may be of any one type of embossing and engraving.

The step may be formed using any one of a sol-gel method and a nano-imprint or printing method.

The depositing of the second conductive material may be performed using electron beam or thermal deposition.

The electrically connecting of the first and second conductive materials may electrically connect the first conductive material with the second conductive material in series.

The forming of the third conductive material may be performed using any one of metal mask, ink jet, screen printing, nano imprint, and stamping.

In a still another aspect, there is provided a method of electrically series interconnecting see-through-type integrated thin-film solar unit cells. The method comprise forming and patterning a first conductive material on a transparent substrate; forming and patterning a second conductive material to be spaced a predetermined distance apart; forming a solar cell layer on the resultant; obliquely depositing a third conductive material on the resultant; obliquely depositing a fourth conductive material on the resultant; etching the solar cell layer using the third and fourth conductive materials as masks; and forming a fifth conductive material to electrically connect the first conductive material with the third conductive material.

The first, third, and fifth conductive materials may be conductive metal materials.

The second conductive material may be a transparent conductive material.

The depositing of the third conductive material may be performed using electron beam or thermal deposition.

The electrically connecting of the first and third conductive materials may electrically connect the first conductive material with the third conductive material in series.

The forming of the fifth conductive material may be performed using any one of metal mask, ink jet, screen printing, nano imprint, and stamping.

In a still another aspect, there is provided a method of electrically series interconnecting see-through-type integrated thin-film solar unit cells. The method comprise forming a first conductive material being apart and strip patterned on a transparent substrate; forming a second conductive material layer being apart and strip patterned to electrically connect a portion of the first conductive material layer with any one of adjacent solar cells, and to be spaced a predetermined distance apart; forming a solar cell(semiconductor) layer; obliquely depositing a third conductive material; etching the solar cell layer using the third conductive material layer as a mask; and obliquely depositing a fourth conductive material to electrically connect the first conductive material layer with the third conductive material layer.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

Preferred embodiments of the present invention will be described in a more detailed manner with reference to the drawings.

Figure 1:
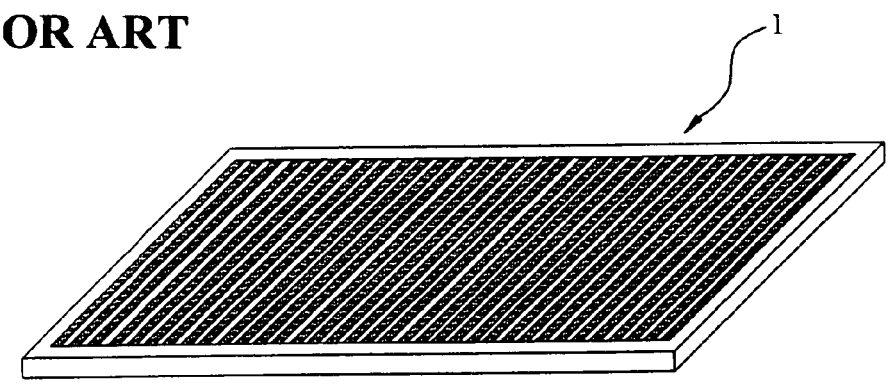
FIG. 1 is a diagram illustrating a structure a conventional integrated thin-film solar cell.
Figure 2:
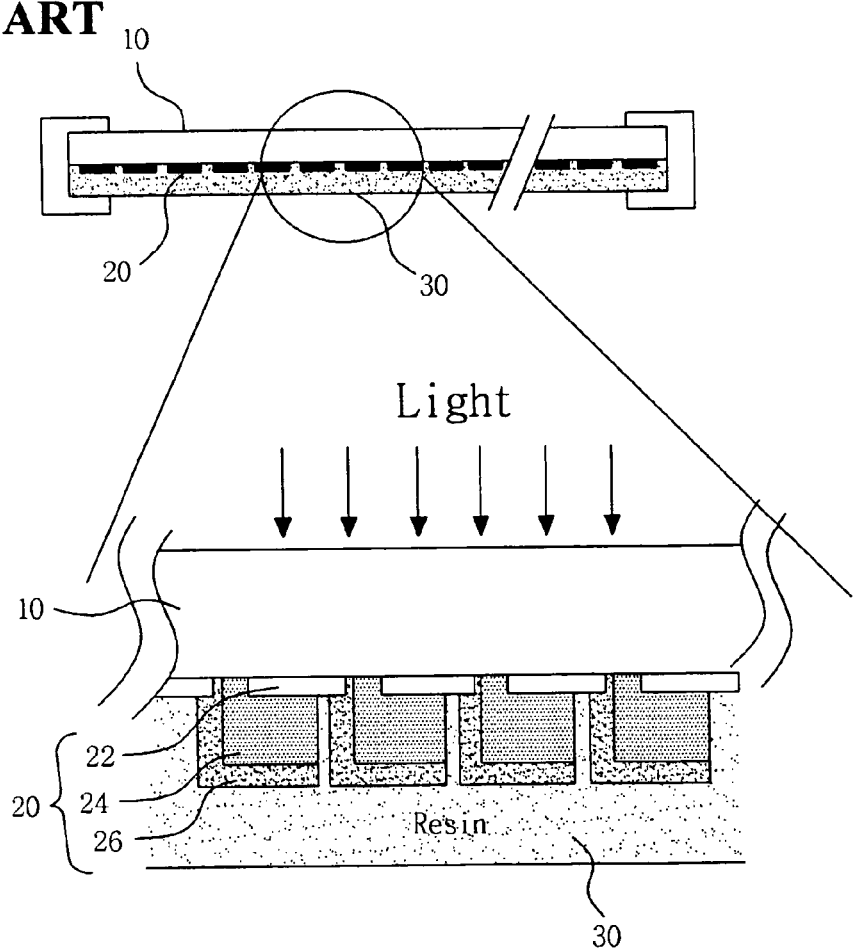
FIG. 2 is a diagram illustrating an example of the conventional integrated thin-film solar cell.
Figure 3:
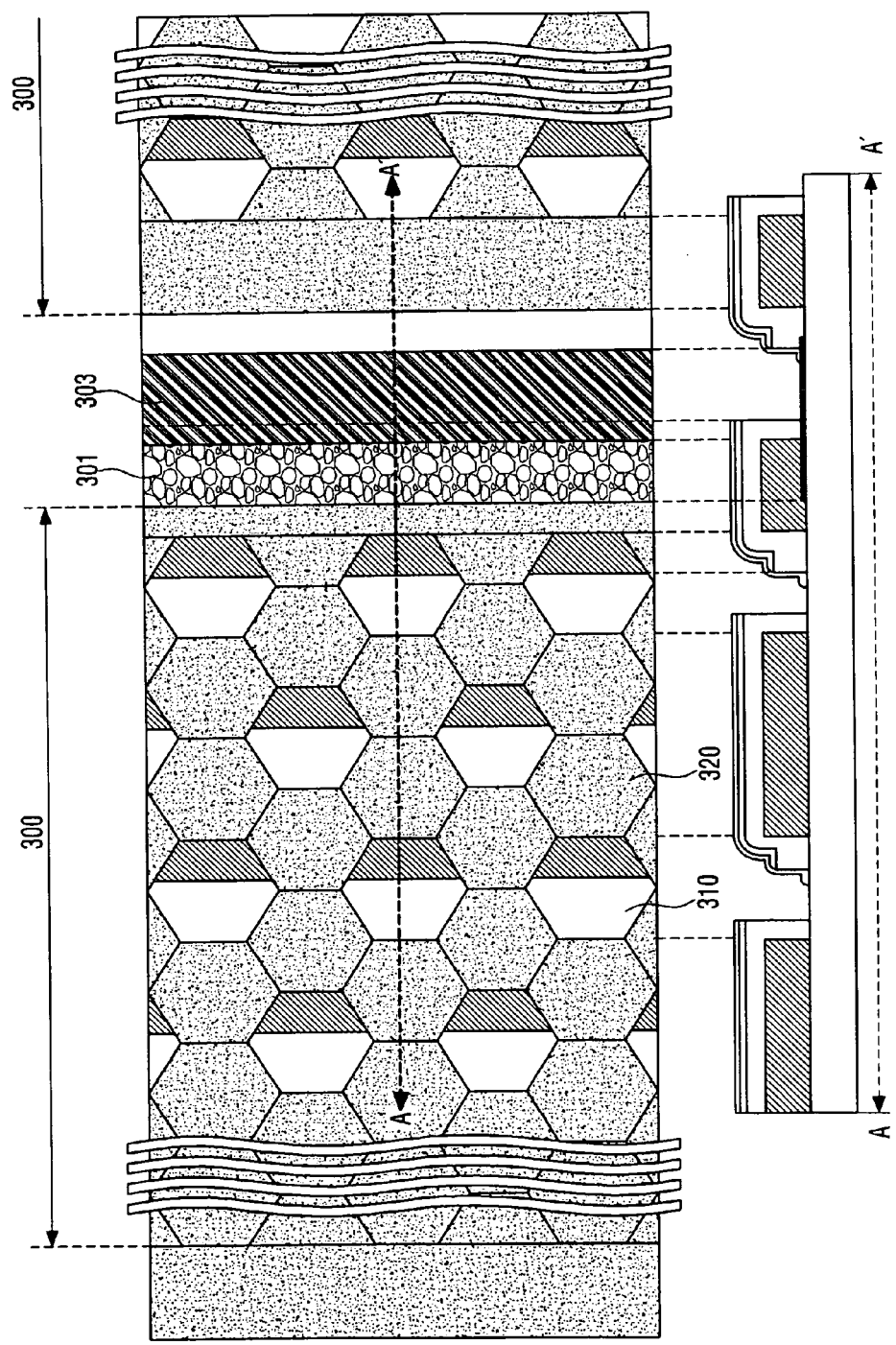
FIG. 3 is a diagram illustrating a structure of a see-through-type integrated solar cell according to the present invention.

FIG. 3 is a diagram illustrating a structure of a see-through-type integrated solar cell according to the present invention.

As shown in FIG. 3, a unit cell 300 of the see-through-type integrated solar cell comprises a light transmission part 310, a solar cell part 320, and connecting parts 301, and 303.

The light transmission part 310 is formed in a predetermined size, and comprises one or more light transmission holes.

In detail, the light transmission parts 310 may be shaped in hexagonal shapes.

The connecting parts 301, and 303 are provided outside of the unit cell 300 so that they interconnect the unit cells 300 with each other, respectively.

In this structure, the unit cells 300 interconnect with each other, thereby forming a solar cell array. The method of the manufacturing of the see-through-type integrated solar cell according to the present invention comprises (a) a first conductive material is formed on a transparent substrate so that it comprises a predetermined space for enabling light to directly pass through the transparent substrate.

The first conductive material comprises the predetermined space to serve as one conductor electrically conducting within the see-through-type integrated solar unit cell. The first conductive material extends by a predetermined interval on a mutual symmetric boundary surface of the see-through-type integrated solar unit cell.

It is desired that the aforementioned predetermined space has a hexagonal shape.

(b) A solar cell (semiconductor) layer is formed on the first conductive material.

(c) A second conductive material is obliquely deposited on the solar cell (semiconductor) layer.

(d) The solar cell layer is etched using the second conductive material as a mask.

The unit cells 300 having the solar cell units 320 formed therein are connected with each other by placing a metal line on the transparent substrate and by using the same method as that of the solar cell.

Figure 4A:
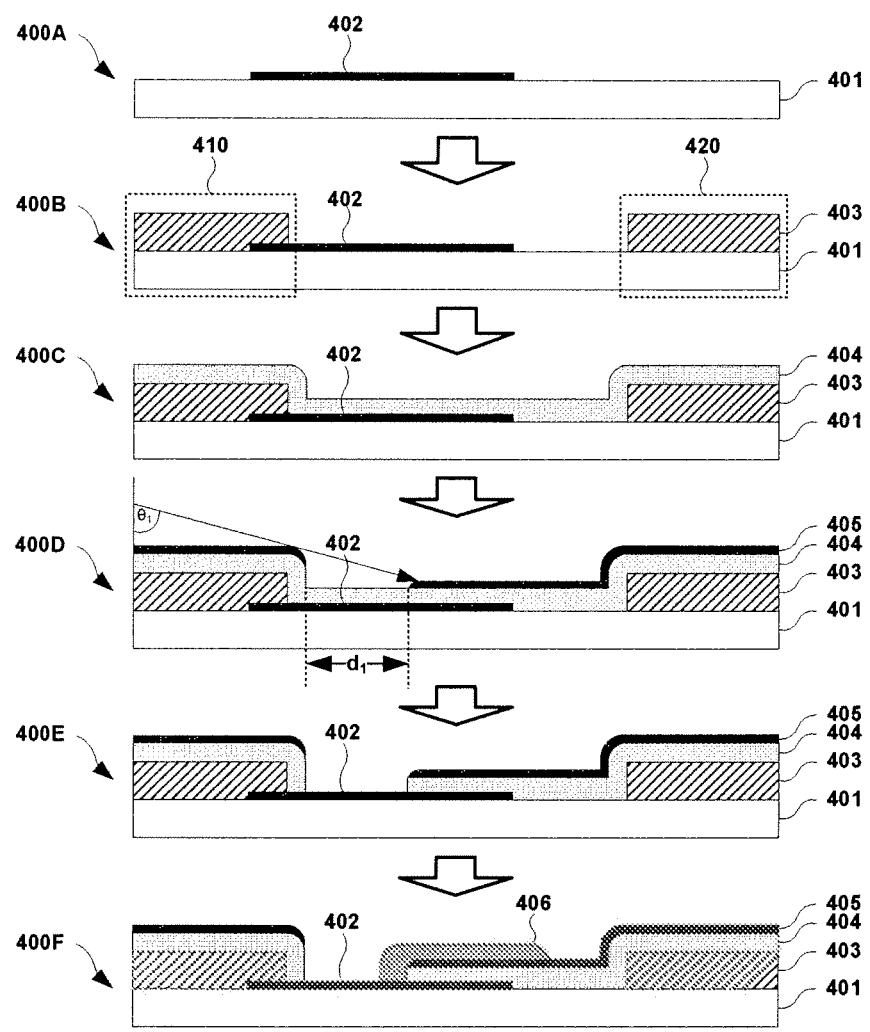
FIG. 4A is a cross-sectional diagram illustrating a structure and a manufacturing method of an see-through-type integrated thin-film solar cell electrically series connected with unit cells according to a first exemplary embodiment of the present invention.

FIG. 4A is a cross-sectional diagram illustrating a structure and a manufacturing method of an see-through-type integrated thin-film solar cell electrically series connected with unit cells according to a first exemplary embodiment of the present invention.

A first conductive material 402 is formed on a substrate 401, and patterned at a predetermined interval with a predetermined width (400A).

The substrate 401 is a transparent substrate. The first conductive material 402, which is metal material, is any one selected from the group consisting of nickel (Ni), chrome (Cr), titanium (Ti), tungsten (W), copper (Cu), silver (Ag), aluminum (Al), and gold (Au).

The second conductive material 403 is formed and patterned so that it is spaced a predetermined distance apart (400B).

In a process of patterning the second conductive material 403, the second conductive material 403 is thinly formed on the substrate 401, photoresist (not shown) or polymer (not shown) is coated on the second conductive material 403 by a printing method, and the photoresist (not shown) or polymer (not shown) is coated so that the second conductive material 403 is mutually spaced a predetermined distance apart by controlling a degree of viscosity of the printed photoresist (not shown) or polymer (not shown).

After the coating, the second conductive material 403 is etched using the photoresist (not shown) or the polymer (not shown) as a mask. After that, the photoresist (not shown) or the polymer (not shown) is removed.

The printing method refers to a screen printing method for coating and patterning a photoresist or polymer thin film by the simplest printing device and a simple and convenient cheap process, or a gravure press method for forming a fine pitch pattern.

An anisotropic or isotropic etching method is used for etching the second conductive material 403. In the isotropic etching method, the second conductive material 403 can be patterned to have curved and slant surfaces at both sides and a width getting greater as it goes to a lower side. In the anisotropic etching method, the second conductive material 403 can be patterned to have a section vertical with the substrate 401, or a section slant with a predetermined slope.

In addition to the above-described methods for patterning the second conductive material 403, there is a method of coating the photoresist using a photolithography, instead of coating the polymer using the printing method. The photolithography is based on a principle in which the photoresist leads to a chemical reaction and varies its property when receiving light.

In a printing method using a sol-gel solution containing a conductive film manufacturing raw material like an ink, a conductive material film can be directly coated on the substrate without using a photoresist or polymer pattern based on the printing method or the photolithography. The printing method makes it possible to directly form and pattern the conductive material film in a band shape in a low temperature process without the etching process using the mask.

If each printing method is used for etching the second conductive material 403 as above, high-density pattern printing is possible, a thin film has an excellent homogeneity, a process is relatively simpler, and an expensive equipment for laser patterning is not needed unlike a conventional method. Thus, a manufacturing cost can reduce.

A technology for patterning and etching the second conductive material 403 has been already filed by this applicant and is assigned Korean Patent Application No. 2005-0021771 entitled "Machining Method and Structure of Transparent Electrode for Integrated thin-film solar cell, and Transparent Substrate having Transparent Electrode". Here, a transparent electrode refers to a conductive material.

The second conductive material 403 is a transparent conductive material, and its main component is one selected from the groups consisting of zinc oxide (ZnO), tin oxide ($SnO_2$), and Indium Tin Oxide (ITO).

The second conductive material 403 is spaced a predetermined distance apart, and is patterned as a first pattern 410 and a second pattern 420, so that the first and second patterns 410 and 420 are formed as the solar cells, respectively. In other words, the solar cells of patterned regions 410 and 420 electrically connect with each other in series, thereby reducing a contact resistance.

After that, a solar cell layer 404 is formed (400C).

The solar cell can be any one or more of a silicon-based solar cell, a compound-based solar cell, and an organic solar cell, or a dry dye-sensitized solar cell.

Among them, the silicon-based solar cell is any one of an amorphous silicon (a-Si:H) single junction solar cell, an a-Si:H/a-Si:H or a-Si:H/a-Si:H/a-Si:H multi-junction solar cell, an amorphous silicon-germanium (a-SiGe:H) single junction solar cell, an a-Si:H/a-SiGe:H double junction solar cell, an a-Si:H/a-SiGe:H/a-SiGe:H triple junction solar cell, and an amorphous silicon/microcrystalline (polycrystalline) silicon double junction solar cell.

After that, a third conductive material 405 is obliquely deposited (400D).

The third conductive material 405 is obliquely deposited using a deposition method such as electron beam or thermal deposition.

It is desirable that the third conductive material 405 is the transparent conductive material, and is at least one selected from the groups consisting of zinc oxide (ZnO), tin oxide (SnO$_2$), and Indium Tin Oxide (ITO).

Thus, when the third conductive material 405 is deposited on a slant with a first incident angle ($\theta_1$) using an electron beam or thermal depositor, it is thinly deposited on the solar cell layer 404 because of straightness of deposition, except for a portion ($d_1$) of the solar cell layer 404. The portion ($d_1$) of the solar cell layer 404 is etched out in the following step.

The solar cell layer 404 is vertically etched using the third conductive material 405 as the mask (400E).

It is desirable to use a dry etching process such as Reactive Ion Etching (RIE).

This method can make it possible to minutely etch the solar cell layer 404 without a need for a specific mask, thereby realizing the insulation gap of several µm to several tens of µm between the unit elements. This can reduce by more than tens of times to hundreds of times compared with conventional plasma-based chemical vaporization machining method and laser beam-based laser patterning method, thereby maximizing an effective area of the solar cell.

Next, a fourth conductive material 406 is formed to electrically connect the first conductive material 402 of the first pattern 410 with the third conductive material 405 of the second pattern 420 (400F).

Any one of metal mask, ink jet, screen printing, nano imprint, and stamping is used to pattern the fourth conductive material 406.

The patterned first conductive material 402 of the first pattern 410 is in direct contact with the second conductive material 403 to reduce the contact resistance. The fourth conductive material 406 is in direct contact with the third conductive material 405 deposited on the patterned first conductive material 402 of the second pattern 420 to reduce the contact resistance.

This structure makes it possible to electrically connect in series the unit cells 300.

Figure 4B:
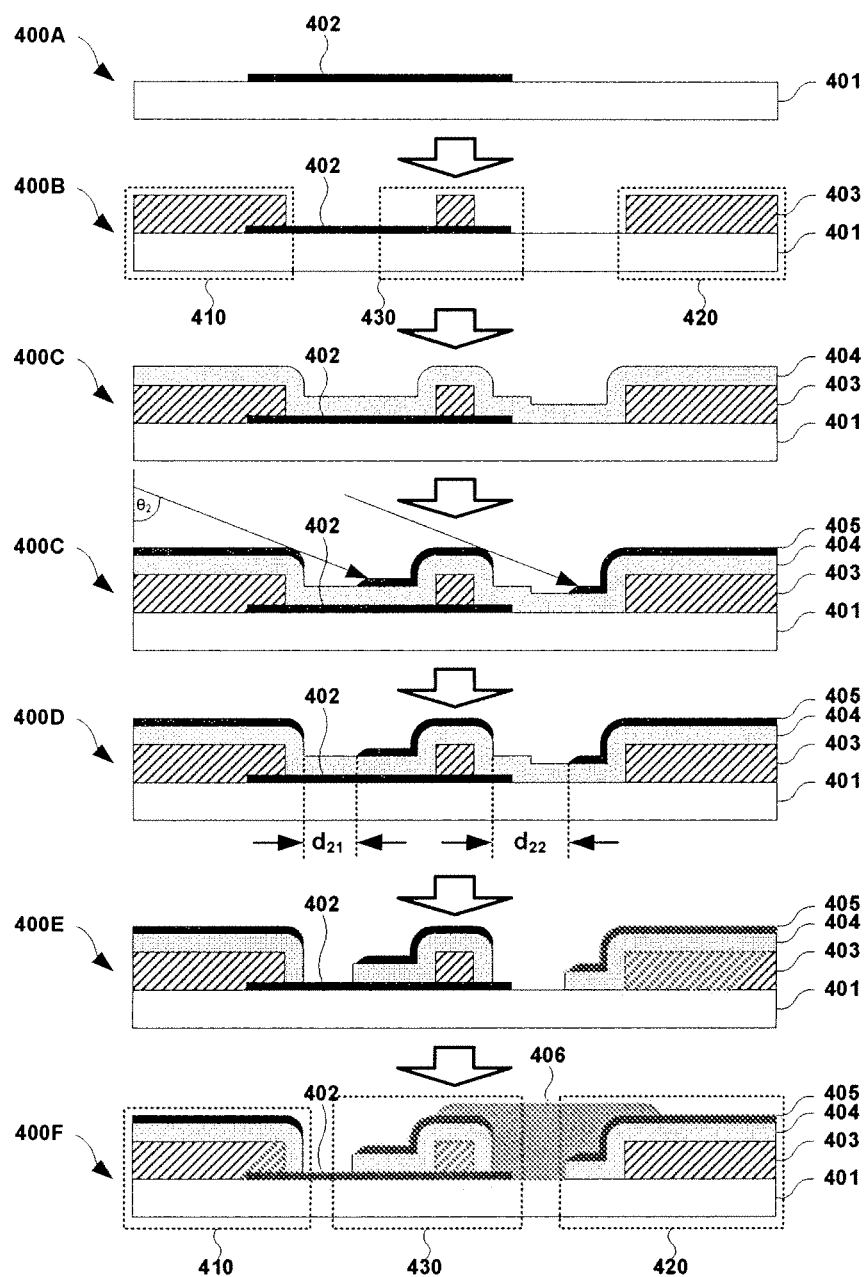
FIG. 4B is a cross-sectional diagram illustrating a structure and a manufacturing method of an see-through-type integrated thin-film solar cell electrically series connected with unit cells according to a modified example of a first exemplary embodiment of the present invention.

FIG. 4B is a cross-sectional diagram illustrating a structure and a manufacturing method of an see-through-type integrated thin-film solar cell electrically series connected with unit cells according to a modified example of a first exemplary embodiment of the present invention.

The first conductive material 402 is formed on the substrate 401, and patterned at a predetermined interval with a predetermined width (400A).

The substrate 401 is a transparent substrate. The first conductive material 402, which is a conductive metal material, is any one selected from the group consisting of nickel (Ni), chrome (Cr), titanium (Ti), tungsten (W), copper (Cu), silver (Ag), aluminum (Al), and gold (Au).

The second conductive material 403 is formed and patterned so that it is spaced a predetermined distance apart (400B).

In a process of patterning the second conductive material 403, the second conductive material 403 is thinly formed on the substrate 401, photoresist (not shown) or polymer (not shown) is coated on the second conductive material 403 by a printing method, and the photoresist (not shown) or polymer (not shown) is coated so that the second conductive material 403 is mutually spaced a predetermined distance apart by controlling a degree of viscosity of the printed photoresist (not shown) or polymer (not shown).

After the coating, the second conductive material 403 is etched using the photoresist (not shown) or the polymer (not shown) as a mask. After that, the photoresist (not shown) or the polymer (not shown) is removed.

The printing method is a screen printing method for coating and patterning a photoresist or polymer thin film by the simplest printing device and a simple and convenient cheap process, or a gravure press method for forming a fine pitch pattern.

An anisotropic or isotropic etching method is used for etching the second conductive material 403. In the isotropic etching method, the second conductive material 403 can be patterned to have curved and slant surfaces at both sides and a width getting greater as it goes to a lower side. In the anisotropic etching method, the second conductive material 403 can be patterned to have a section vertical with the substrate 401, or a section slant with a predetermined slope.

In addition to the above-described methods for patterning the second conductive material 403, there is a method of coating the photoresist using a photolithography, instead of coating the polymer using the printing method. The photolithography is based on a principle in which the photoresist leads to a chemical reaction and varies a property when receiving light.

In a printing method using a sol-gel solution containing a conductive film manufacturing raw material like an ink, a conductive material film can be directly coated on the substrate without using a photoresist or polymer pattern based on the printing method or the photolithography. The printing method makes it possible to directly form and pattern the conductive material film in a band shape in a low temperature process without the etching process using the mask.

If each printing method is used for etching the second conductive material 403 as above, high-density pattern printing is possible, a thin film has an excellent homogeneity, a process is relatively simpler, and an expensive equipment for laser patterning is not needed unlike a conventional method. Thus, a manufacturing cost can reduce.

A technology for patterning and etching the second conductive material 403 has been already filed by this applicant and is assigned Korean Patent Application No. 2005-0021771 entitled "Machining Method and Structure of Transparent Electrode for Integrated thin-film solar cell, and Transparent Substrate having Transparent Electrode". Here, a transparent electrode refers to a conductive material.

The second conductive material 403 is a transparent conductive material, and its main component is one selected from the groups consisting of zinc oxide (ZnO), tin oxide (SnO$_2$), and Indium Tin Oxide (ITO).

The second conductive material 403 is spaced a predetermined distance apart, and is patterned as a first pattern 410, a second pattern 420, and a dummy pattern 430 so that the first and second patterns 410 and 420 are formed as the solar cells, respectively. The dummy pattern 430 is formed at a predetermined distance to prevent the first and second patterns 410 and 420 from being electrically short-circuited on a process. Also, there is provided a method for electrically connecting the solar cells of patterned regions 410 and 420 in series, thereby reducing a contact resistance.

After that, a solar cell layer 404 is formed (400C).

The solar cell can be any one or more of a silicon-based solar cell, a compound-based solar cell, and an organic solar cell, or a dry dye-sensitized solar cell.

Among them, the silicon-based solar cell is any one of an amorphous silicon (a-Si:H) single junction solar cell, an a-Si:H/a-Si:H or a-Si:H/a-Si:H/a-Si:H multi-junction solar cell, an amorphous silicon-germanium (a-SiGe:H) single junction solar cell, an a-Si:H/a-SiGe:H double junction solar cell, an a-Si:H/a-SiGe:H/a-SiGe:H triple junction solar cell, and an amorphous silicon/microcrystalline (polycrystalline) silicon double junction solar cell.

After that, a third conductive material 405 is obliquely deposited (400D).

The third conductive material 405 is obliquely deposited using a deposition method such as electron beam or thermal deposition.

It is desirable that the third conductive material 405 is the transparent conductive material, and is at least one selected from the groups consisting of zinc oxide (ZnO), tin oxide ($SnO_2$), and Indium Tin Oxide (ITO).

Thus, when the third conductive material 405 is deposited on a slant with a second incident angle ($\theta_2$) using an electron beam or thermal depositor, it is thinly deposited on the solar cell layer 404 because of straightness of deposition, except for portions ($d_{21}$ and $d_{22}$) of the solar cell layer 404. The portions ($d_{21}$ and $d_{22}$) of the solar cell layer 404 are etched out in the following step.

The solar cell layer 404 is vertically etched using the third conductive material 405 as the mask (400E).

It is desirable to use a dry etching process such as Reactive Ion Etching (RIE).

This method can make it possible to minutely etch the solar cell layer 404 without a need for a specific mask, thereby realizing the insulation gap of several μm to several tens of μm between the unit elements. This can reduce by more than tens of times to hundreds of times compared with conventional plasma-based chemical vaporization machining method and laser beam-based laser patterning method, thereby maximizing an effective area of the solar cell.

Next, a fourth conductive material 406 is formed to electrically connect the first conductive material 402 of the dummy pattern 430 with the third conductive material 405 of the second pattern 420 (400F).

Any one of the metal mask, the ink jet, the screen printing, the nano imprint, and the stamping is used to pattern the fourth conductive material 406.

The first conductive material 402 is in direct contact with the patterned second conductive material 403 of the first pattern 410 to reduce the contact resistance. The fourth conductive material 406 is in direct contact with the patterned second conductive material 403 of the dummy pattern 430 and the patterned third conductive material 405 of the second pattern 420 to reduce the contact resistance.

This structure makes it possible to electrically connect in series the unit cells 300.

Figure 5:
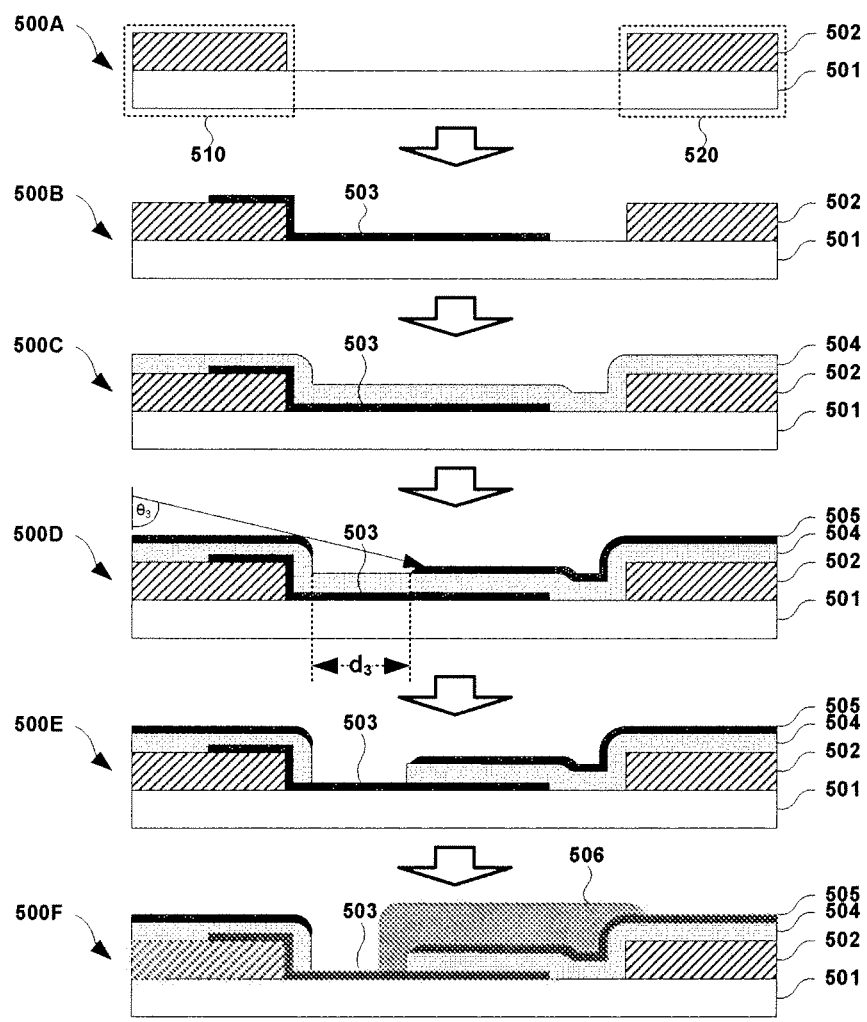
FIG. 5 is a cross-sectional diagram illustrating a structure and a manufacturing method of an see-through-type integrated thin-film solar cell electrically series connected with unit cells according to a second exemplary embodiment of the present invention.

FIG. 5 is a cross-sectional diagram illustrating a structure and a manufacturing method of an see-through-type integrated thin-film solar cell electrically series connected with unit cells according to a second exemplary embodiment of the present invention.

A first conductive material 502 is formed on a substrate 501, and patterned at a predetermined interval with a predetermined width (500A).

The first conductive material 502 is patterned as a first pattern 510 and a second pattern 520. A process of patterning the first conductive material 502 will be sufficiently understood by those skilled in the art with the description of FIG. 4A.

A second conductive material 503 is formed and patterned (500B).

A portion of the second conductive material 503 is in direct contact with the first conductive material 502 of the first pattern 510.

After that, a solar cell layer 504 is formed (500C).

A method of forming the solar cell layer 504 will be sufficiently understood by those skilled in the art as in the description of FIG. 4A.

After that, a third conductive material 505 is obliquely deposited (500D).

When the third conductive material 505 is deposited on a slant with a third incident angle ($\theta_3$) using an electron beam or thermal depositor, it is thinly deposited on the solar cell layer 504 because of straightness of deposition, except for a portion ($d_3$) of the solar cell layer 504.

The portion ($d_1$) of the solar cell layer 504 is etched out in the following step.

A deposition method will be sufficiently understood by those skilled in the art as in the description of FIG. 4A.

The solar cell layer 504 is vertically etched using the third conductive material 505 as the mask (500E).

A method of vertically etching the solar cell layer 504 will be understood by those skilled in the art as in the description of FIG. 4A.

Next, a fourth conductive material 506 is formed to electrically connect the first conductive material 502 of the first pattern 510 with the third conductive material 505 of the second pattern 520 (500F).

A method of forming the fourth conductive material 506 will be sufficiently understood by those skilled in the art as in the description of FIG. 4A.

In this structure, a portion of the second conductive material 503 is in direct contact with the patterned first conductive material 502 of the first pattern 510 to reduce the contact resistance. The fourth conductive material 506 is in direct contact with the second conductive material 503 and the third conductive material 505 deposited on the patterned first conductive material 502 of the second pattern 520 to reduce the contact resistance.

That is, the unit cell formed on the first pattern 510 is electrically connected in series to the unit cell formed on the second pattern 520. Accordingly, the unit thin film solar cell can be integrated through a relative simple process.

Figure 6A:
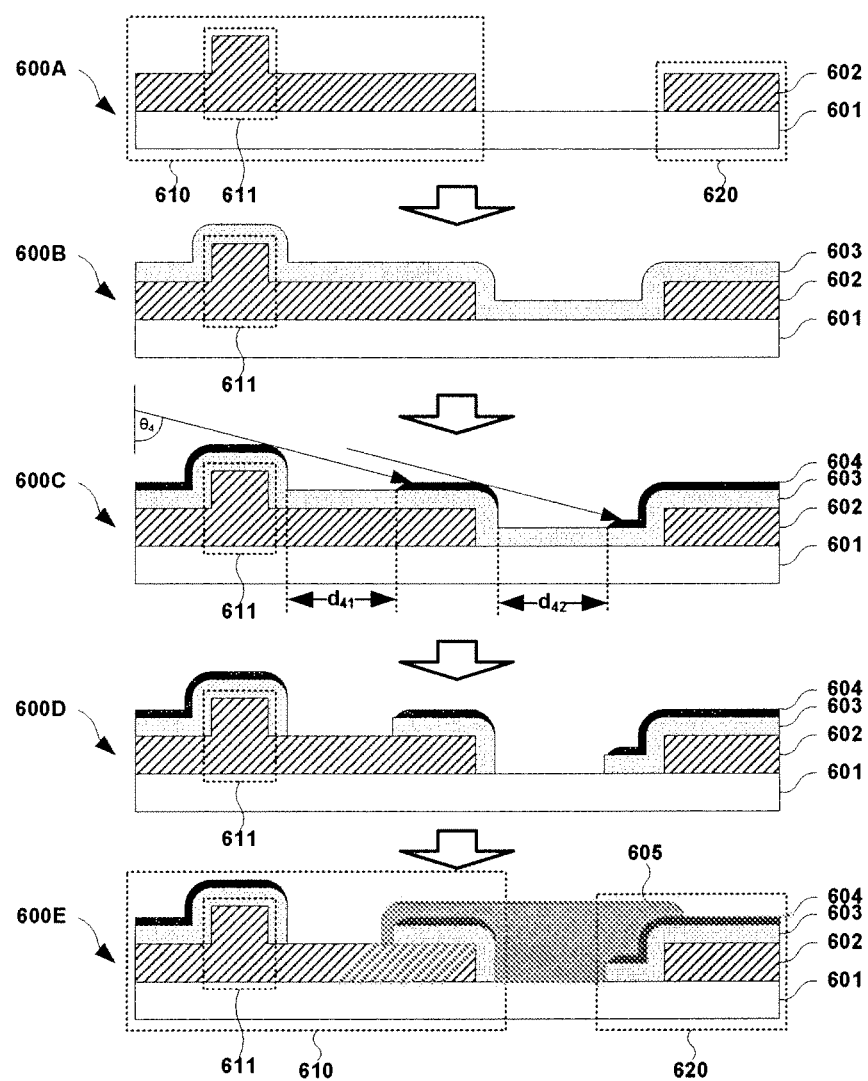
FIG. 6A is a cross-sectional diagram illustrating a structure and a manufacturing method of an see-through-type integrated thin-film solar cell electrically series connected with unit cells according to a third exemplary embodiment of the present invention.

FIG. 6A is a cross-sectional diagram illustrating a structure and a manufacturing method of an see-through-type integrated thin-film solar cell electrically series connected with unit cells according to a third exemplary embodiment of the present invention.

A first conductive material 602 is formed on a substrate 601, and patterned at a predetermined interval with a predetermined width (600A).

The first conductive material 602 is patterned as a first pattern 610 and a second pattern 620. A process of patterning the first conductive material 602 will be sufficiently understood by those skilled in the art with the description of FIG. 4A.

The first conductive material 602 of the first pattern 610 is formed to have a single step (embossing) 611 using any one of a sol-gel method and a nano-imprint or printing method.

After that, a solar cell layer 603 is formed (600B).

A method of forming the solar cell layer 603 will be understood by those skilled in the art as in the description of FIG. 4A.

After that, a second conductive material 604 is obliquely deposited (600C).

When the second conductive material 604 is deposited on a slant with a fourth incident angle ($\theta_4$) using an electron beam or thermal depositor, it is thinly deposited on the solar cell layer 603 because of straightness of deposition, except for portions ($d_{41}$ and $d_{42}$) of the solar cell layer 603.

The portions ($d_{41}$ and $d_{42}$) of the solar cell layer 603 are etched out in the following step.

A deposition method will be sufficiently understood by those skilled in the art as in the description of FIG. 4A.

The solar cell layer 603 is vertically etched using the second conductive material 604 as the mask (600D).

A method of vertically etching the solar cell layer 603 will be understood by those skilled in the art as in the description of FIG. 4A.

Next, a third conductive material 605 is formed to electrically connect the first conductive material 602 of the first pattern 610 with the second conductive material 604 of the second pattern 620 (600E).

A method of forming the third conductive material 605 will be sufficiently understood by those skilled in the art as in the description of FIG. 4A.

In this structure, the third conductive material 605 is in direct contact with the patterned first conductive material 602 of the first pattern 610 to reduce the contact resistance. The third conductive material 605 is in direct contact with the second conductive material 604 deposited on the patterned first conductive material 602 of the second pattern 620 to reduce the contact resistance.

That is, the unit cell formed on the first pattern 610 is electrically connected in series to the unit cell formed on the second pattern 620. Accordingly, the unit thin film solar cell can be integrated through a relative simple process.

Figure 6B:
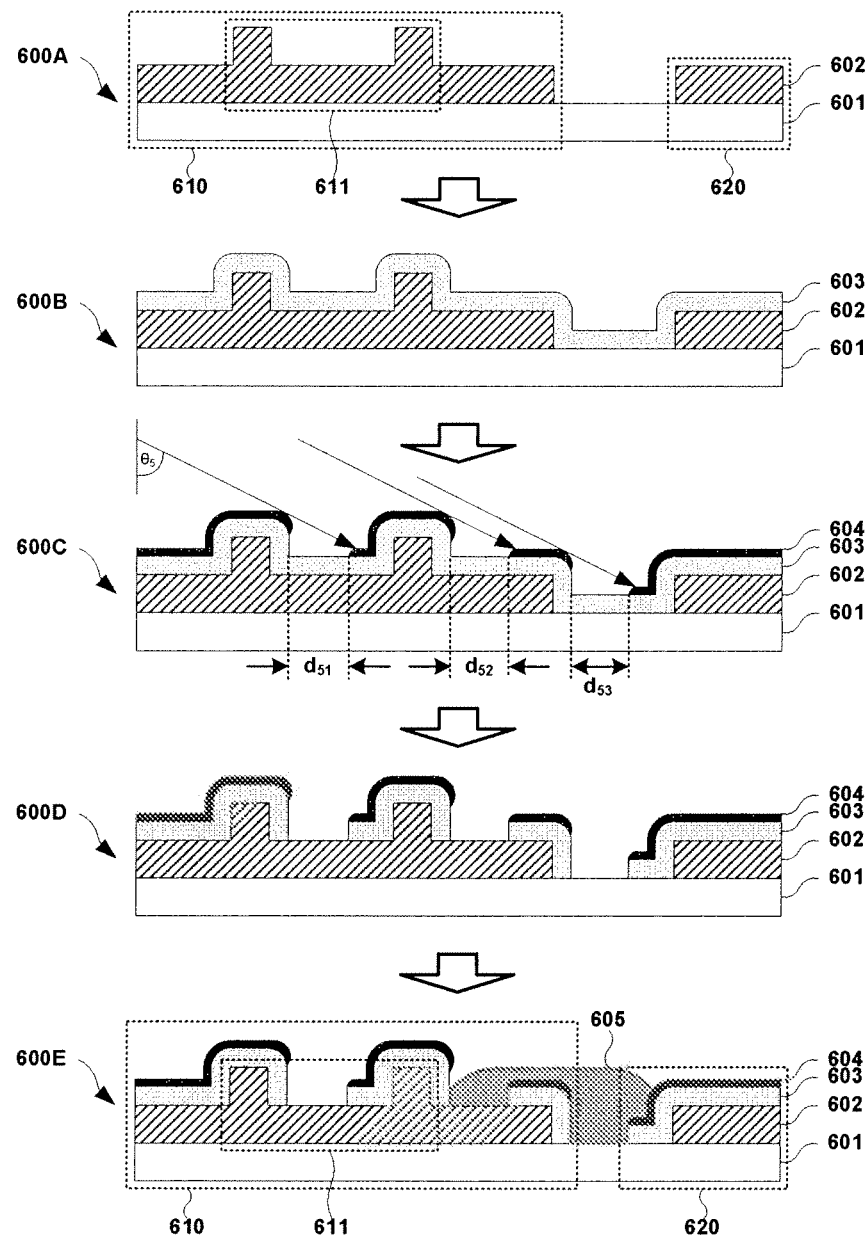
FIG. 6B is a cross-sectional diagram illustrating a structure and a manufacturing method of an see-through-type integrated thin-film solar cell electrically series connected with unit cells according to a modified example of a third exemplary embodiment of the present invention.

FIG. 6B is a cross-sectional diagram illustrating a structure and a manufacturing method of an see-through-type integrated thin-film solar cell electrically series connected with unit cells according to a modified example of a third exemplary embodiment of the present invention The structure and the manufacturing method of the integrated thin-film solar cell formed on the substrate according to the modified example of the third exemplary embodiment of the present invention as shown in FIG. 6B will be described as follows.

The first conductive material 602 is formed on the substrate 601, and patterned at a predetermined interval with a predetermined width (600A).

The first conductive material 602 is spaced a predetermined distance apart and patterned as a first pattern 610 and a second pattern 620, so that the first pattern 610 and the second pattern 620 are formed as solar cells. A method of electrically connecting the solar cells of patterned regions 610 and 620 in series, thereby reducing the contact resistance is provided.

The first conductive material 602 is patterned as the first pattern 610 and the second pattern 620. A process of patterning the first conductive material 602 will be sufficiently understood by those skilled in the art with the description of FIG. 4A.

The first conductive material 602 of the first pattern 610 is formed to have a dual step (embossing) 611 using any one of a sol-gel method and a nano-imprint or printing method.

After that, a solar cell layer 603 is formed (600B).

A method of forming the solar cell layer 603 will be understood by those skilled in the art as in the description of FIG. 4A.

After that, a second conductive material 604 is obliquely deposited (600C).

When the second conductive material 604 is deposited on a slant with a fifth incident angle ($\theta_5$) using an electron beam or thermal depositor, it is thinly deposited on the solar cell layer 603 because of straightness of deposition, except for portions ($d_{51}$, $d_{52}$, and $d_{53}$) of the solar cell layer 603.

The portions ($d_{51}$, $d_{52}$, and $d_{53}$) of the solar cell layer 603 are etched out in the following step.

A deposition method will be sufficiently understood by those skilled in the art as in the description of FIG. 4A.

The solar cell layer 603 is vertically etched using the second conductive material 604 as the mask (600D).

A method of vertically etching the solar cell layer 603 will be understood by those skilled in the art as in the description of FIG. 4A.

Next, a third conductive material 605 is formed to electrically connect the first conductive material 602 of the first pattern 610 with the second conductive material 604 of the second pattern 620 (600E).

A method of forming the third conductive material 605 will be sufficiently understood by those skilled in the art as in the description of FIG. 4A.

In this structure, the third conductive material 605 is in direct contact with the patterned first conductive material 602 of the first pattern 610 to reduce the contact resistance. The third conductive material 605 is in direct contact with the second conductive material 604 deposited on the patterned first conductive material 602 of the second pattern 620 to reduce the contact resistance.

That is, the unit cell formed on the first pattern 610 is electrically connected in series to the unit cell formed on the second pattern 620. The dual step (embossing) 611 prevents the first pattern 610 and the second pattern 620 from being electrically short-circuited. Accordingly, the unit thin film solar cell can be integrated through a relative simple process.

Figure 7A:
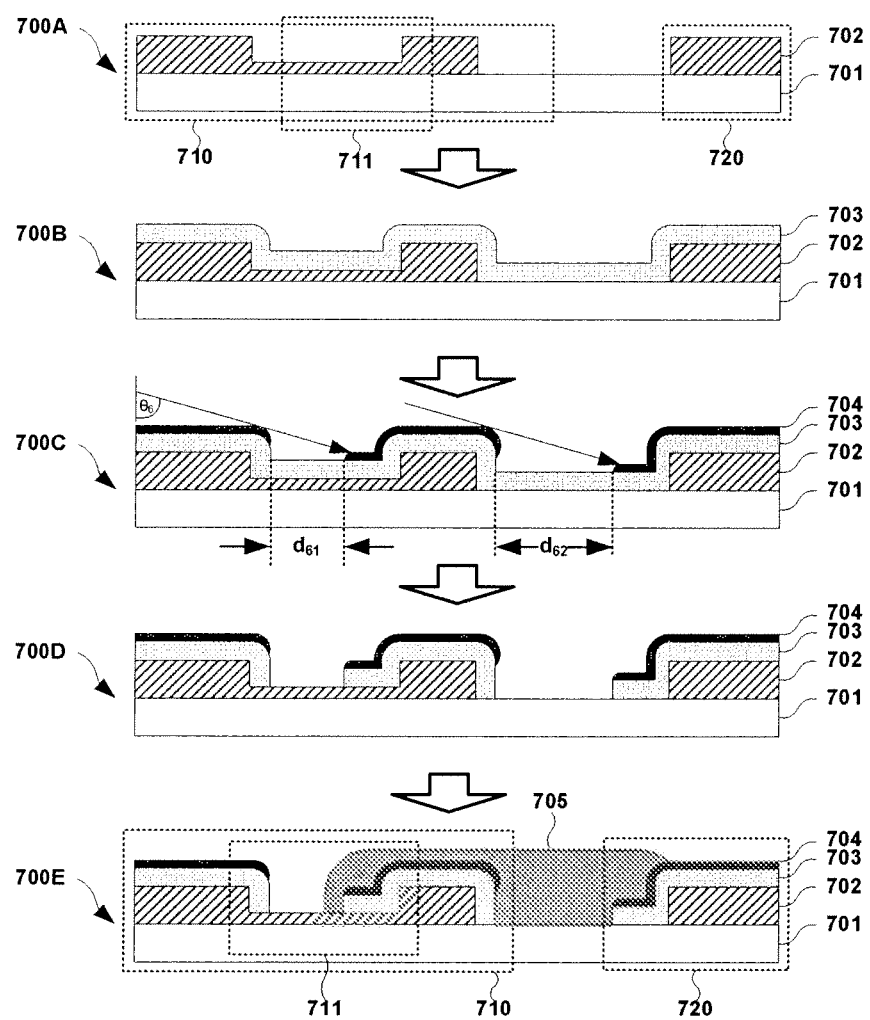
FIG. 7A is a cross-sectional diagram illustrating a structure and a manufacturing method of an see-through-type integrated thin-film solar cell electrically series connected with unit cells according to a fourth exemplary embodiment of the present invention.

FIG. 7A is a cross-sectional diagram illustrating a structure and a manufacturing method of an see-through-type integrated thin-film solar cell electrically series connected with unit cells according to a fourth exemplary embodiment of the present invention.

A first conductive material 702 is formed on a substrate 701, and patterned at a predetermined interval with a predetermined width (700A).

The first conductive material 702 is patterned as a first pattern 710 and a second pattern 720. A process of patterning the first conductive material 702 will be sufficiently understood by those skilled in the art with the description of FIG. 4A.

The first conductive material 702 of the first pattern 710 is formed to have a single step (engraving) 711 using any one of a sol-gel method and a nano-imprint or printing method.

After that, a solar cell layer 703 is formed (700B).

A method of forming the solar cell layer 703 will be understood by those skilled in the art as in the description of FIG. 4A.

After that, a second conductive material 704 is obliquely deposited (700C).

When the second conductive material 704 is deposited on a slant with a sixth incident angle ($\theta_6$) using an electron beam or thermal depositor, it is thinly deposited on the solar cell layer 703 because of straightness of deposition, except for portions ($d_{61}$ and $d_{62}$) of the solar cell layer 703.

The portions ($d_{61}$ and $d_{62}$) of the solar cell layer 703 are etched out in the following step.

A deposition method will be sufficiently understood by those skilled in the art as in the description of FIG. 4A.

The solar cell layer 703 is vertically etched using the second conductive material 704 as the mask (700D).

A method of vertically etching the solar cell layer 703 will be understood by those skilled in the art as in the description of FIG. 4A.

Next, a third conductive material 705 is formed to electrically connect the first conductive material 702 of the first pattern 710 with the second conductive material 704 of the second pattern 720 (700E).

A method of forming the third conductive material 705 will be sufficiently understood by those skilled in the art as in the description of FIG. 4A.

In this structure, the third conductive material 705 is in direct contact with the patterned first conductive material 702 of the first pattern 710 to reduce the contact resistance. The third conductive material 705 is in direct contact with the second conductive material 704 deposited on the patterned first conductive material 702 of the second pattern 720 to reduce the contact resistance.

That is, the unit cell formed on the first pattern 710 is electrically connected in series to the unit cell formed on the second pattern 720. Accordingly, the unit thin film solar cell can be integrated through a relative simple process.

Figure 7B:
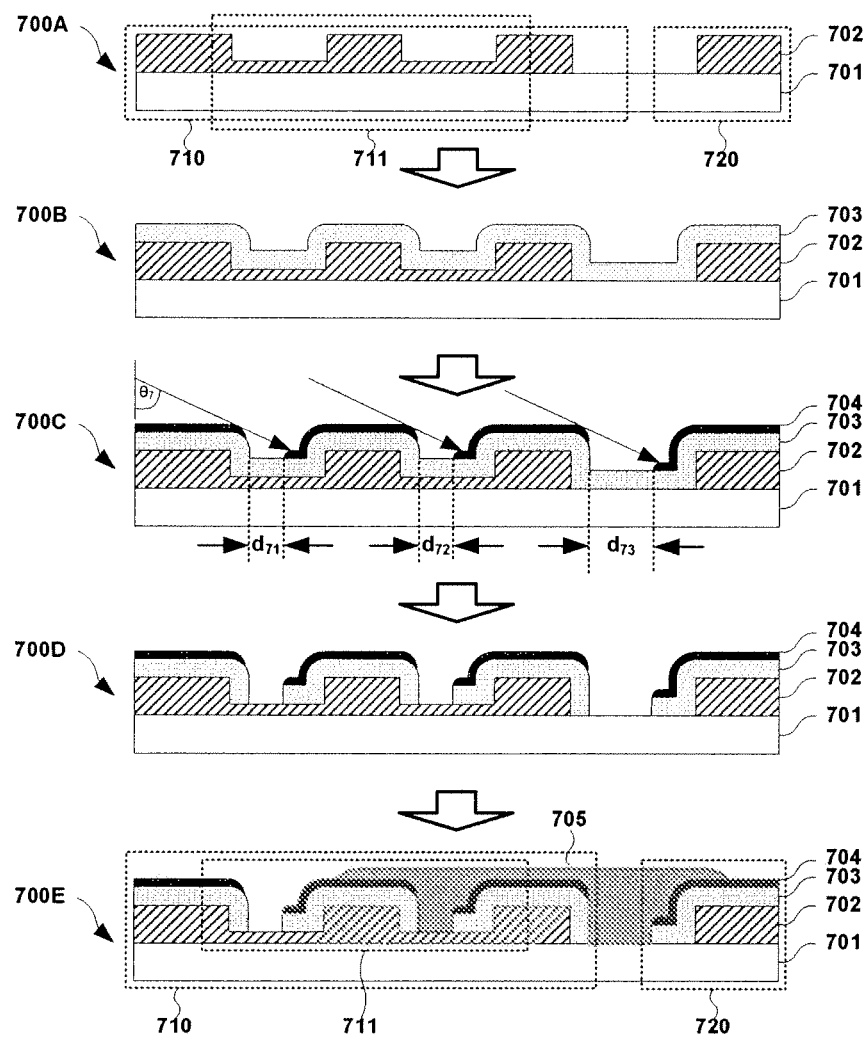
FIG. 7B is a cross-sectional diagram illustrating a structure and a manufacturing method of an see-through-type integrated thin-film solar cell electrically series connected with unit cells according to a modified example of a fourth exemplary embodiment of the present invention.

FIG. 7B is a cross-sectional diagram illustrating a structure and a manufacturing method of an see-through-type integrated thin-film solar cell electrically series connected with unit cells according to a modified example of a fourth exemplary embodiment of the present invention.

The first conductive material 702 is formed on the substrate 701, and patterned at a predetermined interval with a predetermined width (700A).

The first conductive material 702 is spaced a predetermined distance apart and patterned as a first pattern 710 and a second pattern 720, so that the first pattern 710 and the second pattern 720 are formed as solar cells. A method of electrically connecting the solar cells of patterned regions 710 and 720 in series, thereby reducing the contact resistance is provided.

The first conductive material 702 is patterned as the first pattern 710 and the second pattern 720. A process of patterning the first conductive material 702 will be sufficiently understood by those skilled in the art with the description of FIG. 4A.

The first conductive material 702 of the first pattern 710 is formed to have a dual step (engraving) 711 using any one of a sol-gel method and a nano-imprint or printing method.

After that, a solar cell layer 703 is formed (700B).

A method of forming the solar cell layer 703 will be understood by those skilled in the art as in the description of FIG. 4A.

After that, a second conductive material 704 is obliquely deposited (700C).

When the second conductive material 704 is deposited on a slant with a seventh incident angle ($\theta_7$) using an electron beam or thermal depositor, it is thinly deposited on the solar cell layer 703 because of straightness of deposition, except for portions ($d_{71}$, $d_{72}$, and $d_{73}$) of the solar cell layer 703.

The portions ($d_{71}$, $d_{72}$, and $d_{73}$) of the solar cell layer 703 are etched out in the following step.

A deposition method will be sufficiently understood by those skilled in the art as in the description of FIG. 4A.

The solar cell layer 703 is vertically etched using the second conductive material 704 as the mask (700D).

A method of vertically etching the solar cell layer 703 will be understood by those skilled in the art as in the description of FIG. 4A.

Next, a third conductive material 705 is formed to electrically connect the first conductive material 702 of the first pattern 710 with the second conductive material 704 of the second pattern 720 (700E).

A method of forming the third conductive material 705 will be sufficiently understood by those skilled in the art as in the description of FIG. 4A.

In this structure, the third conductive material 705 is in direct contact with the patterned first conductive material 702 of the first pattern 710 to reduce the contact resistance. The third conductive material 705 is in direct contact with the second conductive material 704 deposited on the patterned first conductive material 702 of the second pattern 720 to reduce the contact resistance.

That is, the unit cell formed on the first pattern 710 is electrically connected in series to the unit cell formed on the second pattern 720. The dual step (embossing) 711 prevents the first pattern 710 and the second pattern 720 from being electrically short-circuited. Accordingly, the unit thin film solar cell can be integrated through a relative simple process.

Figure 8:
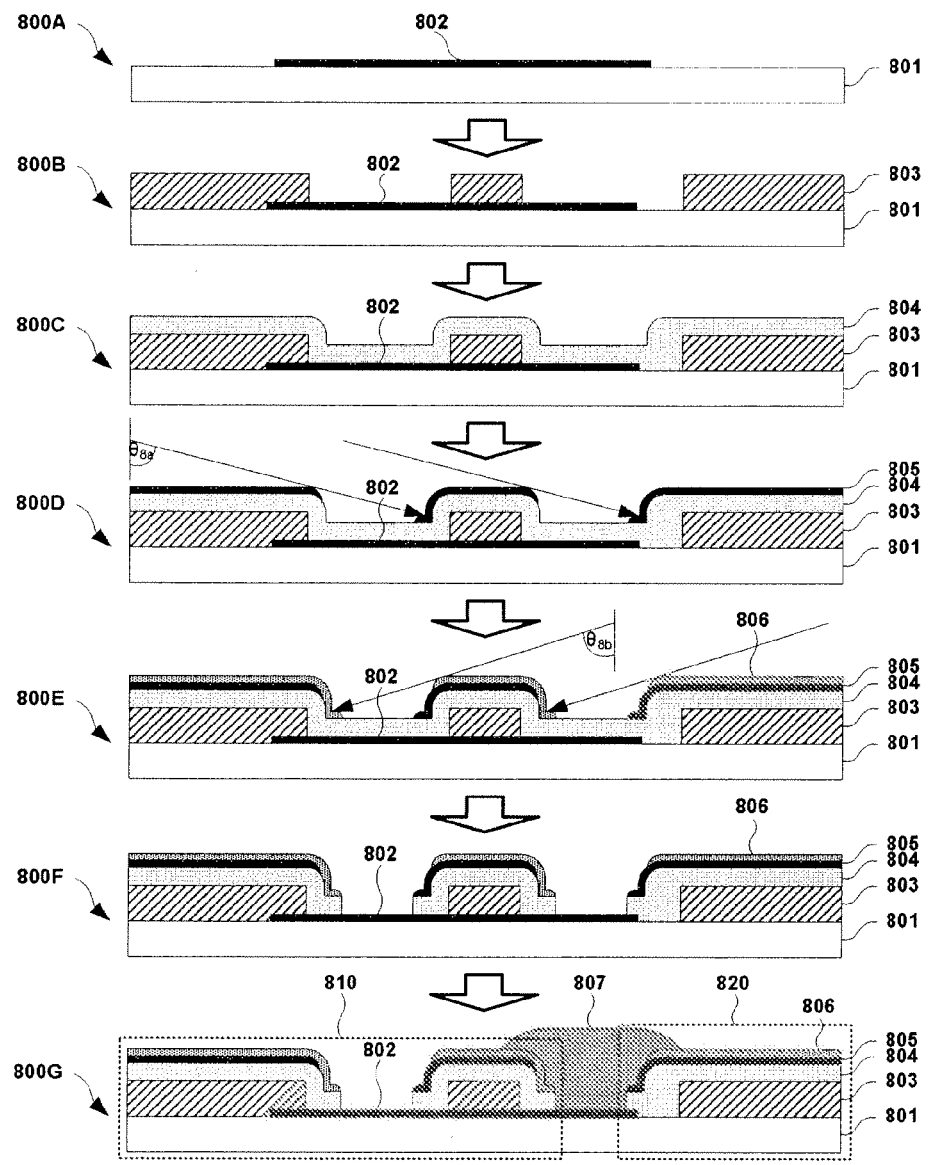
FIG. 8 is a cross-sectional diagram illustrating a structure and a manufacturing method of an see-through-type integrated thin-film solar cell electrically series connected with unit cells according to a fifth exemplary embodiment of the present invention.

FIG. 8 is a cross-sectional diagram illustrating a structure and a manufacturing method of an see-through-type integrated thin-film solar cell electrically series connected with unit cells according to a fifth exemplary embodiment of the present invention.

A first conductive material 802 is formed on a substrate 801, and patterned at a predetermined interval with a predetermined width (800A).

The substrate 801 is a transparent substrate. The first conductive material 802, which is metal material, is any one selected from the group consisting of nickel (Ni), chrome (Cr), titanium (Ti), tungsten (W), copper (Cu), silver (Ag), aluminum (Al), and gold (Au).

The second conductive material 803 is formed and patterned so that it is spaced a predetermined distance apart (800B).

In a process of patterning the second conductive material 803, the second conductive material 803 is thinly formed on the substrate 801, photoresist (not shown) or polymer (not shown) is coated on the second conductive material 803 by a printing method, and the photoresist (not shown) or polymer (not shown) is coated so that the second conductive material 803 is mutually spaced a predetermined distance apart by controlling a degree of viscosity of the printed photoresist (not shown) or polymer (not shown).

After the coating, the second conductive material 803 is etched using the photoresist (not shown) or the polymer (not shown) as a mask. After that, the photoresist (not shown) or the polymer (not shown) is removed.

The printing method is a screen printing method for coating and patterning a photoresist or polymer thin film by the simplest printing device and a simple and convenient cheap process, or a gravure press method for forming a fine pitch pattern.

An anisotropic or isotropic etching method is used for etching the second conductive material 803. In the isotropic etching method, the second conductive material 803 can be patterned to have curved and slant surfaces at both sides and a width getting greater as it goes to a lower side. In the anisotropic etching method, the second conductive material 803 can be patterned to have a section vertical with the substrate 801, or a section slant with a predetermined slope.

In addition to the above-described methods for patterning the second conductive material 803, there is a method of coating the photoresist using a photolithography, instead of coating the polymer using the printing method. The photolithography is based on a principle in which the photoresist leads to a chemical reaction and varies a property when receiving light.

In a printing method using a sol-gel solution containing a conductive film manufacturing raw material like an ink, a conductive material film can be directly coated on the substrate without using a photoresist or polymer pattern based on the printing method or the photolithography. The printing method makes it possible to directly form and pattern the conductive material film in a band shape in a low temperature process without the etching process using the mask.

If each printing method is used for etching the second conductive material 803 as above, high-density pattern printing is possible, a thin film has an excellent homogeneity, a process is relatively simpler, and an expensive equipment for laser patterning is not needed unlike a conventional method. Thus, a manufacturing cost can reduce.

A technology for patterning and etching the second conductive material 803 has been already filed by this applicant and is assigned Korean Patent Application No. 2005-0021771 entitled "Machining Method and Structure of Transparent Electrode for Integrated thin-film solar cell, and Transparent Substrate having Transparent Electrode". Here, a transparent electrode refers to a conductive material.

The second conductive material 803 is a transparent conductive material, and its main component is one selected from the groups consisting of zinc oxide (ZnO), tin oxide ($SnO_2$), and Indium Tin Oxide (ITO).

The second conductive material 803 is spaced a predetermined distance apart, and is patterned as a first pattern 810 and a second pattern 820, so that the first and second patterns 810 and 820 are formed as the solar cells, respectively. In other words, the solar cells of patterned regions 810 and 820 electrically connect with each other in series, thereby reducing a contact resistance.

After that, a solar cell layer 804 is formed (800C).

The solar cell can be any one or more of a silicon-based solar cell, a compound-based solar cell, and an organic solar cell, or a dry dye-sensitized solar cell.

Among them, the silicon-based solar cell is any one of an amorphous silicon (a-Si:H) single junction solar cell, an a-Si:H/a-Si:H or a-Si:H/a-Si:H/a-Si:H multi-junction solar cell, an amorphous silicon-germanium (a-SiGe:H) single junction solar cell, an a-Si:H/a-SiGe:H double junction solar cell, an a-Si:F/a-SiGe:H/a-SiGe:H triple junction solar cell, and an amorphous silicon/microcrystalline (polycrystalline) silicon double junction solar cell.

After that, a third conductive material 805 is obliquely deposited (800D).

The third conductive material 805 is obliquely deposited using a deposition method such as electron beam or thermal deposition.

It is desirable that the third conductive material 805 is the transparent conductive material, and is at least one selected from the groups consisting of zinc oxide (ZnO), tin oxide ($SnO_2$), and Indium Tin Oxide (ITO).

Thus, when the third conductive material 805 is deposited on a slant with a first incident angle ($\theta_{8a}$) using an electron beam or thermal depositor, it is thinly deposited on the solar cell layer 804 because of straightness of deposition, except for a portion of the solar cell layer 804.

The portion of the solar cell layer 804 is etched out in the following step.

After that, a fourth conductive material 806 is obliquely deposited (800E).

The fourth conductive material 806 is obliquely deposited using a deposition method such as electron beam or thermal deposition.

It is desirable that the fourth conductive material 806 is the transparent conductive material, and is at least one selected from the groups consisting of zinc oxide (ZnO), tin oxide ($SnO_2$), and Indium Tin Oxide (ITO).

Thus, when the fourth conductive material 806 is deposited on a slant with a second incident angle ($\theta_{8b}$) using the electron beam or thermal depositor, it is thinly deposited on the solar cell layer 804 because of the straightness of the deposition, except for a portion of the solar cell layer 804.

The portion of the solar cell layer 804 is etched out in the following step.

The solar cell layer 804 is vertically etched using the third conductive material 805 and the fourth conductive material 806 as the mask (800F).

It is desirable to use a dry etching process such as Reactive Ion Etching (RIE).

This method can make it possible to minutely etch the solar cell layer 804 without a need for a specific mask, thereby realizing the insulation gap of several μm to several tens of μm between the unit elements. This can reduce by more than tens of times to hundreds of times compared with conventional plasma-based chemical vaporization machining method and laser beam-based laser patterning method, thereby maximizing an effective area of the solar cell.

Next, a fifth conductive material 807 is formed to electrically connect the first conductive material 802 of the first pattern 810 with the third conductive material 805 and the fourth conductive material 806 of the second pattern 820 (800G).

Any one of metal mask, ink jet, screen printing, nano imprint, and stamping is used to pattern the fifth conductive material 807.

The patterned first conductive material 802 of the first pattern 810 is in direct contact with the second conductive material 803 to reduce the contact resistance. The fifth conductive material 807 is in direct contact with the third conductive material 805 deposited on the patterned first conductive material 802 of the second pattern 820 to reduce the contact resistance.

That is, the unit cell formed on the first pattern 810 is electrically connected in series to the unit cell formed on the second pattern 820. Accordingly, the unit thin film solar cell can be integrated through a relative simple process.

Figure 9:
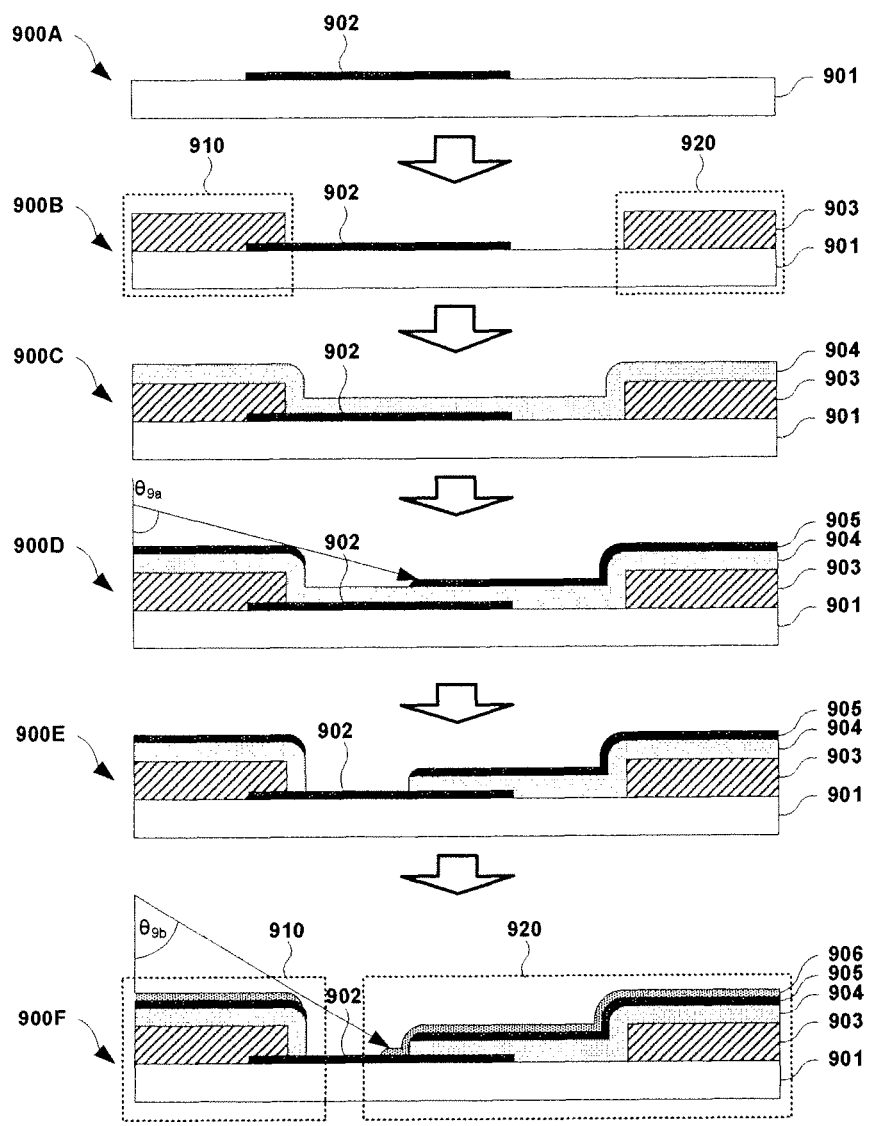
FIG. 9 is a cross-sectional diagram illustrating a structure and a manufacturing method of an see-through-type integrated thin-film solar cell electrically series connected with unit cells according to a sixth exemplary embodiment of the present invention.

FIG. 9 is a cross-sectional diagram illustrating a structure and a manufacturing method of an see-through-type integrated thin-film solar cell electrically series connected with unit cells according to a sixth exemplary embodiment of the present invention.

A first conductive material 902 is formed on a substrate 901, and patterned at a predetermined interval with a predetermined width (900A).

The substrate 901 is a transparent substrate. The first conductive material 902, which is metal material, is any one selected from the group consisting of nickel (Ni), chrome (Cr), titanium (Ti), tungsten (W), copper (Cu), silver (Ag), aluminum (Al), and gold (Au).

The second conductive material 903 is formed and patterned so that it is spaced a predetermined distance apart (900B).

In a process of patterning the second conductive material 903, the second conductive material 903 is thinly formed on the substrate 901, photoresist (not shown) or polymer (not shown) is coated on the second conductive material 903 by a printing method, and the photoresist (not shown) or polymer (not shown) is coated so that the second conductive material 903 is mutually spaced a predetermined distance apart by controlling a degree of viscosity of the printed photoresist (not shown) or polymer (not shown).

After the coating, the second conductive material 903 is etched using the photoresist (not shown) or the polymer (not shown) as a mask. After that, the photoresist (not shown) or the polymer (not shown) is removed.

The printing method is a screen printing method for coating and patterning a photoresist or polymer thin film by the simplest printing device and a simple and convenient cheap process, or a gravure press method for forming a fine pitch pattern.

An anisotropic or isotropic etching method is used for etching the second conductive material 903. In the isotropic etching method, the second conductive material 903 can be patterned to have curved and slant surfaces at both sides and a width getting greater as it goes to a lower side. In the anisotropic etching method, the second conductive material 903 can be patterned to have a section vertical with the substrate 901, or a section slant with a predetermined slope.

In addition to the above-described methods for patterning the second conductive material 903, there is a method of coating the photoresist using a photolithography, instead of coating the polymer using the printing method. The photolithography is based on a principle in which the photoresist leads to a chemical reaction and varies a property when receiving light.

In a printing method using a sol-gel solution containing a conductive film manufacturing raw material like an ink, a conductive material film can be directly coated on the substrate without using a photoresist or polymer pattern based on the printing method or the photolithography. The printing method makes it possible to directly form and pattern the conductive material film in a band shape in a low temperature process without the etching process using the mask.

If each printing method is used for etching the second conductive material 903 as above, high-density pattern printing is possible, a thin film has an excellent homogeneity, a process is relatively simpler, and an expensive equipment for laser patterning is not needed unlike a conventional method. Thus, a manufacturing cost can reduce.

A technology for patterning and etching the second conductive material 903 has been already filed by this applicant and is assigned Korean Patent Application No. 2005-0021771 entitled "Machining Method and Structure of Transparent Electrode for Integrated thin-film solar cell, and Transparent Substrate having Transparent Electrode". Here, a transparent electrode refers to a conductive material.

The second conductive material 903 is a transparent conductive material, and its main component is one selected from the groups consisting of zinc oxide (ZnO), tin oxide ($SnO_2$), and Indium Tin Oxide (ITO).

The second conductive material 903 is spaced a predetermined distance apart, and is patterned as a first pattern 910 and a second pattern 920, so that the first and second patterns 910 and 920 are formed as the solar cells, respectively. In other words, the solar cells of patterned regions 910 and 920 electrically connect in series, thereby reducing a contact resistance.

After that, a solar cell layer 904 is formed (900C).

The solar cell can be any one or more of a silicon-based solar cell, a compound-based solar cell, and an organic solar cell, or a dry dye-sensitized solar cell.

Among them, the silicon-based solar cell is any one of an amorphous silicon (a-Si:H) single junction solar cell, an a-Si:H/a-Si:H or a-Si:H/a-Si:H/a-Si:H multi-junction solar cell, an amorphous silicon-germanium (a-SiGe:H) single junction solar cell, an a-Si:H/a-SiGe:H double junction solar cell, an a-Si:f/a-SiGe:H/a-SiGe:H triple junction solar cell, and an amorphous silicon/microcrystalline (polycrystalline) silicon double junction solar cell.

After that, a third conductive material 905 is obliquely deposited (900D).

The third conductive material 905 is obliquely deposited using a deposition method such as electron beam or thermal deposition.

It is desirable that the third conductive material 905 is the transparent conductive material, and is at least one selected from the groups consisting of zinc oxide (ZnO), tin oxide ($SnO_2$), and Indium Tin Oxide (ITO).

Thus, when the third conductive material 905 is deposited on a slant with a first incident angle ($\theta_1$) using an electron beam or thermal depositor, it is thinly deposited on the solar cell layer 904 because of straightness of deposition, except for a portion ($d_1$) of the solar cell layer 904. The portion ($d_1$) of the solar cell layer 904 is etched out in the following step.

The solar cell layer 904 is vertically etched using the third conductive material 905 as the mask (900E).

It is desirable to use a dry etching process such as Reactive Ion Etching (RIE).

This method can make it possible to minutely etch the solar cell layer 904 without a need for a specific mask, thereby realizing the insulation gap of several μm to several tens of μm between the unit elements. This can reduce by more than tens of times to hundreds of times compared with conventional plasma-based chemical vaporization machining method and laser beam-based laser patterning method, thereby maximizing an effective area of the solar cell.

Next, a fourth conductive material 906 is obliquely formed to electrically connect the first conductive material 902 of the first pattern 910 with the third conductive material 905 of the second pattern 920 (900F).

The fourth conductive material 906 is obliquely deposited using a deposition method such as electron beam or thermal deposition.

It is desirable that the fourth conductive material 906 is the transparent conductive material, and is at least one selected from the groups consisting of zinc oxide (ZnO), tin oxide ($SnO_2$), and Indium Tin Oxide (ITO).

Thus, when the fourth conductive material 906 is deposited on a slant with a second incident angle ($\theta_{9b}$) using an electron beam or thermal depositor, it is thinly deposited on the solar cell layer 904 because of the straightness of the deposition, except for a portion of the solar cell layer 904.

That is, the unit cell formed on the first pattern 910 is electrically connected in series to the unit cell formed on the second pattern 920. Accordingly, the unit thin film solar cell can be integrated through a relative simple process.

As described above, the present invention has an effect that the insulation gap between the unit elements of the see-through-type integrated thin-film solar cell can reduce by tens of times to hundreds of times compared with the conventional laser patterning and chemical vaporization machining method, thereby maximizing the effective area of the solar cell and thus, improving a performance of the unit cell of the solar cell.

Also, the present invention has an effect that a self alignment is possible, thereby making a precision position control unit unnecessary, and etching is performed using the printing method at the time of machining the transparent electrode, thereby making an expensive equipment such as a laser and a precision position control system unnecessary and thus, reducing the manufacturing cost, and the unit cell can be prevented from being deteriorated in performance due to its exposure to the atmosphere because all processes after the forming of the transparent electrode are performed under vacuum.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a see-through-type thin-film integrated solar cell, the method comprising the steps of:

forming on a transparent substrate a plurality of first conductive material strips which are separated from each other;

forming, on the transparent substrate on which the plurality of the first conductive material strips have been formed, a plurality of second conductive material strips which are separated from each other, each of which being overlapped with and electrically connected to a portion of the first conductive material strip corresponding to the second conductive material strip among the plurality of the first conductive material strips, and including predetermined light-passing spaces;

forming a solar cell layer on the entire surface of the transparent substrate on which the first conductive material strips and the second conductive material strips have been formed;

depositing obliquely a third conductive material layer on the solar cell layer such that one or more portions of the solar cell layer remain exposed;

etching the exposed portion of the solar cell layer by using the third conductive material layer as a mask such that the surface of a portion of the first conductive material strip is exposed; and forming a fourth conductive material such that the first conductive material strip is electrically connected to the third conductive material layer adjacent to the first conductive material strip.

2. The method of claim 1, wherein the first conductive material is a metallic material.

3. The method of claim 1, wherein the predetermined space is provided in a hexagonal shape.

4. The method of claim 1, wherein the second conductive material is a transparent conductive material.

* * * * *